(12) United States Patent
Mangold et al.

(10) Patent No.: US 8,174,315 B1
(45) Date of Patent: May 8, 2012

(54) METHOD AND CIRCUIT FOR TRANSFORMING THE IMPEDANCE OF A LOAD

(75) Inventors: Tobias Mangold, Weilheim (DE); Andreas Weisgerber, Munich (DE)

(73) Assignee: TriQuint Semiconductor, Inc., Hillsboro, OR (US)

( * ) Notice: Subject to any disclaimer, the term of this patent is extended or adjusted under 35 U.S.C. 154(b) by 340 days.

(21) Appl. No.: 12/430,779

(22) Filed: Apr. 27, 2009

(51) Int. Cl.
*H03F 1/00* (2006.01)
(52) U.S. Cl. ........................................ 330/195; 330/165
(58) Field of Classification Search .................. 330/165, 330/124 R, 197, 195, 276, 295
See application file for complete search history.

(56) References Cited

U.S. PATENT DOCUMENTS

| | | | |
|---|---|---|---|
| 5,276,912 A | 1/1994 | Siwiak | |
| 5,361,403 A | 11/1994 | Dent | |
| 5,423,074 A | 6/1995 | Dent | |
| 5,564,086 A | 10/1996 | Cygan | |
| 6,522,201 B1 | 2/2003 | Hsiao | |
| 6,806,767 B2 | 10/2004 | Dow | |
| 6,856,199 B2 | 2/2005 | Komijani | |
| 6,992,543 B2 * | 1/2006 | Luetzelschwab et al. | .... 330/195 |
| 7,053,728 B2 | 5/2006 | Park | |
| 2008/0094149 A1 | 4/2008 | Brobston | |

OTHER PUBLICATIONS

Francesco Carrara, et al., "A 2.4 GHz 24-dBm SOI CMOS Power Amplifier with Fully Integrated Reconfigurable Output Matching Network," IEEE Transactions on Microwave Theory and Techniques, vol. 57, No. 9, Sep. 2009.

* cited by examiner

*Primary Examiner* — Khanh Nguyen
(74) *Attorney, Agent, or Firm* — Schwabe Williamson & Wyatt

(57) ABSTRACT

According to an embodiment, a method is provided that includes: adapting the impedance of the load dependent on working conditions of the active device using a controllable output-side adaptation network coupled between an output-side terminal of a transformer and an output-side node, to generate an adapted impedance of the load, adjusting the adapted impedance independent of the working conditions of the active device, using the transformer including a first inductor having a first terminal to receive the output of the active device via the input-side node, a second inductor having an output-side terminal, where the second inductor is magnetically coupled to the first inductor.

31 Claims, 2 Drawing Sheets

METHOD AND CIRCUIT FOR TRANSFORMING THE IMPEDANCE OF A LOAD

FIELD

The present disclosure relates to methods and circuits for transforming the impedance of a load. Such methods and circuits can be used in connection with active devices like radio frequency power amplifiers or high-efficiency power amplifiers.

BACKGROUND

In many applications that require the use of active devices, like radio frequency communication or radar detection, it is often desirable to operate the active device in a highly efficient manner over a wide output power range and a wide frequency range. In the case of high-efficiency RF power amplifiers with variable output power, this can be achieved by using a variable supply voltage/current. Variable DC power supplies are typically realized by silicon based DC/DC converters. However, this solution is expensive and typically not suited for full integration in combination with state-of-the-art power amplifiers used in wireless communication devices.

Another factor that determines the efficiency of an active device is the impedance of the load at the output of the active device. However, providing a load with the optimal impedance for a particular active device over a wide range of working conditions of the active device can be difficult to achieve.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Reference will now be made in detail to various embodiments, one or more examples of which are illustrated in the figures. Each example is provided by way of explanation, and is not meant as a limitation of embodiments of the invention. For example, features illustrated or described as part of one embodiment can be used on or in conjunction with other embodiments to yield yet a further embodiment. It is intended that embodiments of the present invention includes such modifications and variations. The examples are described using specific language which should not be construed as limiting the scope of the appending claims. The drawings are not scaled and are for illustrative purposes only.

As used herein, the term "active device" refers to one or more amplifier devices. These amplifier devices are typically semiconductor devices manufactured in a variety of technologies including, but being not limited to, silicon, silicon germanium, silicon carbide, gallium arsenide, and gallium nitride technologies. The active devices usually include transistors including, but being not limited to, heterojunction bipolar transistors (HBTs), bipolar junction transistors (BJTs), high electron mobility transistors (HEMTs), and metal oxide semiconductor field effect transistors (MOSFETs). The active devices can be configured as single-ended or balanced devices and also the circuits described herein can be configured as single-ended or balanced circuits.

As used herein the term "efficiency" generally refers to RF power output divided by DC power input. Efficiency is also referred to as "drain efficiency" when applied to field effect transistors (FETS). Other types of efficiencies include power-added efficiency (PAE), total transmitter efficiency, amplitude modulated efficiency, etc. The term "coupled to," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
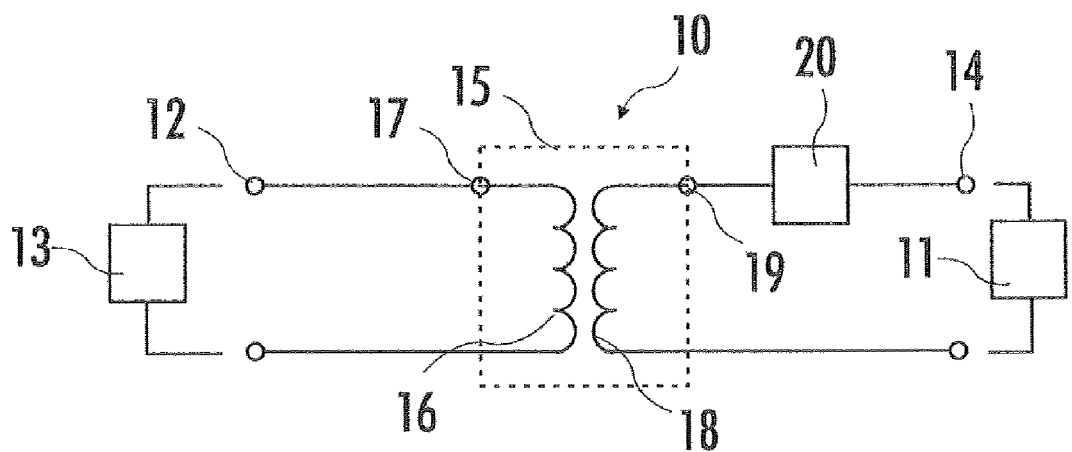
FIG. 1 shows a circuit for transforming the impedance of a load according to an embodiment.

FIG. 1 shows a circuit 10 for transforming the impedance of a load according to an embodiment. The circuit 10 adjusts the impedance of a load 11 within a predetermined frequency interval of a signal output from an active device 13 along a path between an input-side node 12 connected to the active device 13 and an output-side node 14 connected to the load 11. The circuit 10 includes a transformer 15. The transformer 15 includes a first inductor 16 having input-side terminal 17 to receive the output of the active device via the input-side node 12. The transformer 15 further includes a second inductor 18 having an output-side terminal 19, where the second inductor 18 is magnetically coupled to the first inductor 16. The circuit 10 further includes a controllable output-side adaptation network 20 coupled between the output-side node 14 and the output-side terminal 19.

During operation, the circuit 10 performs a method for transforming the impedance of the load 11 within a predetermined frequency interval of a signal output from the active device 13 along the path between the input-side node 12 connected to the active device 13 and the output-side node 14 connected to the load 11. The method includes adapting the impedance of the load 11 dependent on working conditions of the active device 13, using the controllable output-side adaptation network 20, to generate an adapted impedance of the load 11, and adjusting the adapted impedance within a predetermined frequency of a signal along a path between the active device 13 and the load 11, independent of the working conditions of the active device 13, using the transformer 15, to generate an adjusted impedance of the load 11.

Thus, the embodiment shown schematically in FIG. 1 represents a variable load line approach and has the capability of full integration. While maintaining essential low loss requirements, it can be combined with GaAs power amplifiers for mobile communication devices and offers a low-cost solution. Furthermore, it allows for variable impedance matching and a broadband characteristic. Hence, it is well suited for converged power amplifier architectures that might be seen in future generations of mobile devices, e.g., mobile phones. Furthermore, it is able to support multiple frequency bands at once.

The embodiment shown in FIG. 1 allows for maintaining high efficiency values for active devices, e.g. power amplifiers, operated at varying output power levels supplied with a constant supply voltage. Since power amplifiers are typically optimized for high efficiency at a certain output power level and given supply voltage, the embodiment allows for maintaining high efficiency values even in a back-off mode of linear as well as non-linear operation.

In some applications, power amplifiers operate in a non-linear mode. Under those circumstances, the embodiment shown in FIG. 1 allows the amplifiers to remain saturated over a wide power range. Furthermore, the embodiment shown in FIG. 1 allows low output noise over a wide power range.

The controllable output-side adaptation network 20 coupled between the output-side terminal 14 and the output-side node 19 is controlled by a control circuit (not shown) based on the working conditions to which the active device is subjected. These working conditions may include, but are not limited to, temperature conditions, battery charge conditions, required output power, required linearity behavior, and required noise behavior.

According to a further embodiment, as explained below, the real part of the adjusted impedance of the load 11 seen by the output of the active device 13 is adjusted in such a way that the requested output power of the active device 13 is close to the maximum possible output power related to the adjusted impedance. As a result, the active device 13 is consistently operated at high efficiency values for variable output levels. Furthermore, the imaginary part of the adjusted impedance of the load may be, for example, smaller than 20% of the real part of the adjusted impedance of the load.

According to a further embodiment, the transformer 15 is an integrated transformer where the two coupled inductors 16 and 18 are formed on a single substrate. Furthermore, the coupling constant k of the transformer is preferably larger than 0.8. According to another embodiment, the impedance of the first inductor lies in a range between the output impedance of the active device and 2 times the output impedance of the active device. For example, the impedance of the first inductor may lie within a range between 1.2 times the output impedance of the active device and 2 times the output impedance of the active device.

According to another embodiment, the impedance of the second inductor 18 lies in a range between the output impedance of the load and 2 times the output impedance of the load. For example, the impedance of the second inductor 18 may lie within a range between 1.2 times the output impedance of the load and 2 times the output impedance of the load. Furthermore, the transformation ratio of the transformer 15 is preferably fixed.

The embodiment shown in FIG. 1 allows for low insertion losses, as the controllable output-side adaptation network 20 has high impedance levels close to that of the output load 11 as compared to the input impedance, which typically has significantly lower impedance. Therefore, the additional series resistance of variable reactive elements like varactor diodes, or parallel combinations of FET switches in series with constant capacitors, shows only a marginal increase in insertion loss compared to equivalent non-tunable circuitry.

Figure 2:
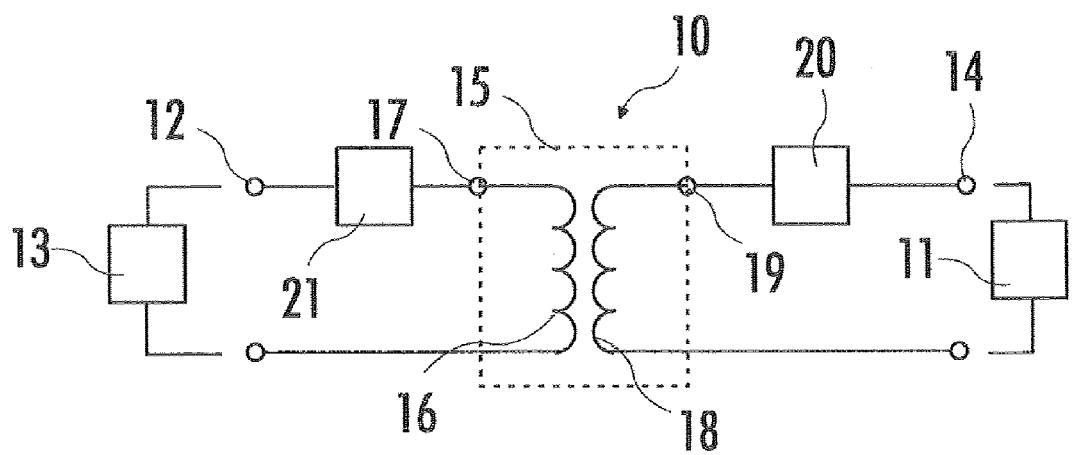
FIG. 2 shows a circuit for transforming the impedance of a load according to another embodiment.

FIG. 2 shows a circuit 10 for transforming the impedance of a load according to another embodiment. The circuit 10 transforms the impedance of a load 11 within a predetermined frequency interval of a signal along a path between an input-side node 12 connected to an active device 13 and an output-side node 14 connected to the load 11. The circuit 10 includes a transformer 15. The transformer 15 includes two coupled inductors 16 and 18, which contribute to the overall impedance transformation from the output side to the input side. The circuit 10 further includes a controllable input-side adaptation network 21 coupled between the input-side node 12 and the input-side terminal 17.

During operation, the circuit 10 works in such a way that the real part of the complex RF impedance seen at the input side can be altered by controlling the output-side adaptation network 20, while a fixed load impedance $Z_{Load}$ is attached to the output of the circuit 10. In this way, the imaginary part of the complex RF input impedance can be kept nearly stable. This characteristic can be maintained for a frequency bandwidth, for example, of at least 6%, preferably at least 10%. For example, the frequency interval of the signal can range from −3% to +3% around a center frequency of the signal, or, for example, −5% to +5% around a center frequency of the signal.

Figure 3:
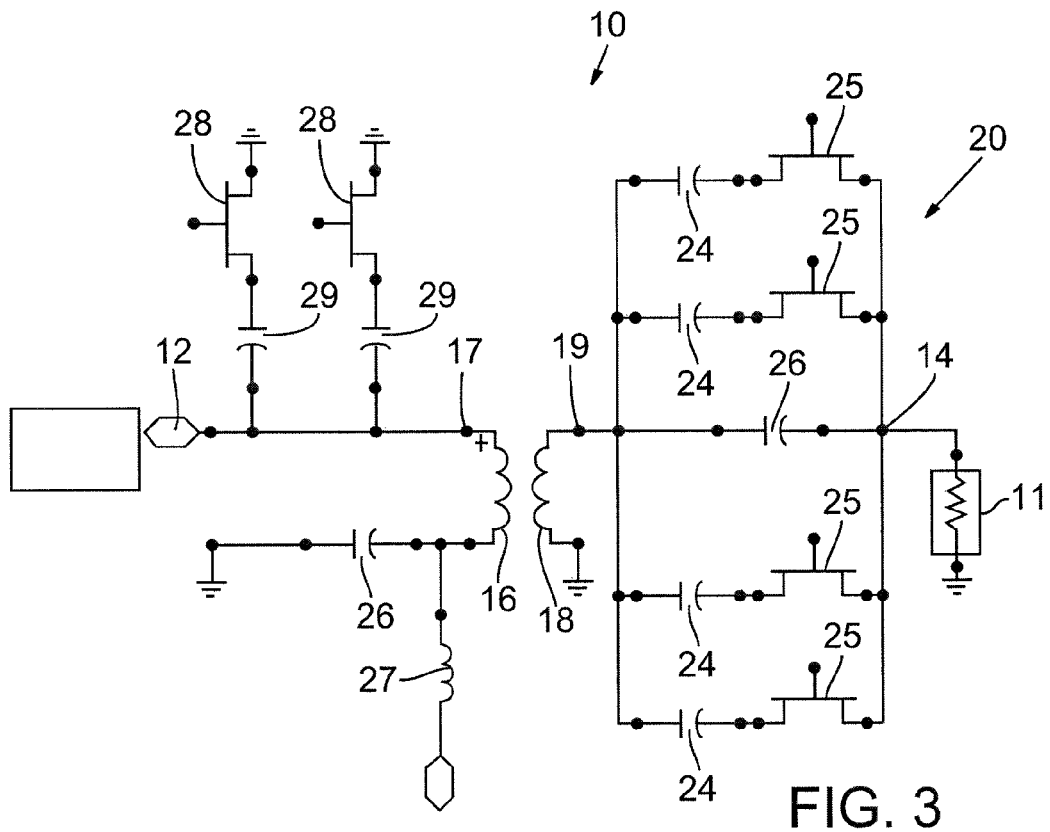
FIG. 3 shows a circuit for transforming the impedance of a load according to another embodiment.

A further embodiment is described with reference to FIG. 3. The circuit 10 includes a transformer 15, which contributes to the overall impedance transformation from the output to the input side. Furthermore, the circuit 10 includes a controllable output-side adaptation network 20. In the embodiment shown in FIG. 3, the controllable output-side adaptation network 20 includes a parallel circuit of the capacitors 24 as a capacitive element. Although FIG. 3 is described in terms of capacitors as a capacitive element, varactor diodes, parallel circuits of at least two capacitors, or microelectromechanical systems may also be used as a capacitive element. Each of the capacitors 24 is arranged in series between the output-side terminal 19 and the output-side node 14.

The controllable output-side adaptation network 20 further includes transistors 25 as switching elements responsive to control signals from a control circuit (not shown). Thus, the capacitance of the capacitive element formed by the capacitors 24 is controllable. Each of the capacitors 24 is connected in series with a transistor 25. Although FIG. 3 is described in terms of transistors as switching elements, microelectromechanical system switches (MEMS switches) may also be used as switching elements. The impedance of the load, as seen at the input side, is adapted by controlling the capacitance of the capacitive element formed by the capacitors 24 of controllable output-side adaptation network 20, e.g., by switching the capacitive element.

The circuit 10 further includes a set of capacitors 26 and 29 in shunt and/or series configuration on both sides of the coupled inductors 16 and 18. An additional inductor 27 in a shunt configuration is present on the input side of the transformer. Additional inductors can be provided in shunt and/or series configuration on both sides of the coupled inductors 16 and 18.

On the input side of the transformer 15, two capacitors 29 are provided in a shunt configuration. Each of the capacitors 29 is arranged in series between the input-side node 12 and the input-side terminal 17. In order to provide additional flexibility, switching elements 28 are provided, whereby each switching element 28 is connected in series with a capacitor 29. The impedance of the load, as seen at the output side, is adapted by switching the capacitance of the capacitive element formed by the capacitors 29 of controllable input-side adaptation network 21. Even though switching elements 25 and 28 are used to control the capacitors 24 and 29, respectively, switching elements might also be used in order to control an inductive element present in controllable input-side adaptation network 21 or the controllable output-side adaptation network 20.

Furthermore, the controllable input-side adaptation network 21 or the controllable output-side adaptation network 20 might also contain resistive, optionally variable elements. Again, at least one element of the controllable output-side adaptation network 20 is variable, in order to achieve tunable RF input impedance as described as above.

The basic advantage of the embodiments described herein is their simplicity to achieve broadband load line switching in power amplifier applications. Due to their simplicity, the embodiments described herein can be implemented at considerably reduced costs relative to prior art solutions.

Furthermore, the embodiments can be realized as a low-loss integrated solution. The embodiments allow the realization of broadband variable impedance matching networks, which can achieve a desired shift in the real part of an input impedance using a small number of variable lumped elements.

A variable impedance matching network can be provided that allows building more valuable power amplifiers with increased back-off efficiency, or reduced current consumption at different modulations or power levels for a fixed supply voltage. Thus, the need for any DC/DC converter is reduced.

Furthermore, the embodiments described herein allow for significantly increased talk time of WCDMA mobile devices, because the mobile device manufacturer is able to switch the load depending on the modulation required (voice or data). In the voice mode, current is most critical in WCDMA phones, and is compromised by the linearity requirements of the data mode (back off). The embodiments may provide a reduction in current consumption based on the modulation conditions.

Furthermore, the embodiments allow individual adoption of a band converged power amplifier module to different duplexer losses in different bands. This may provide a significant reduction in current consumption.

Furthermore, the broadband nature of the embodiments described herein allows implementing the variable load-line concept in a converged power amplifier architecture supporting more than a single band.

Figure 4:
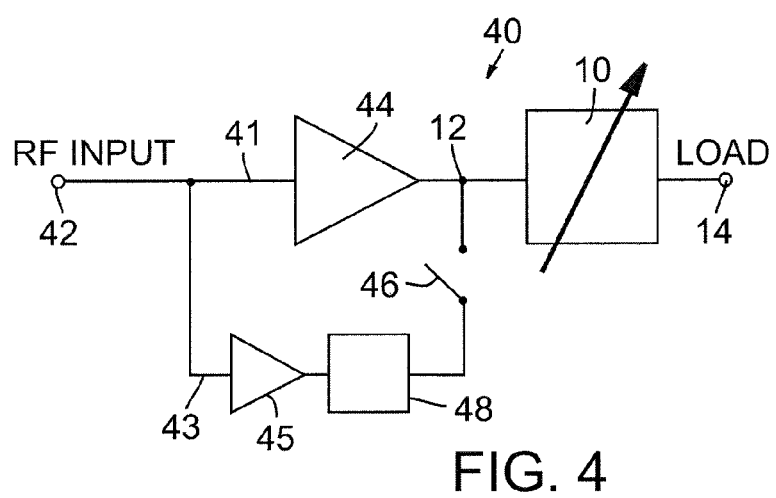
FIG. 4 shows an amplifier circuit according to another embodiment.

FIG. 4 is a schematic block diagram illustrating an exemplary amplifier circuit 40 according to a further embodiment. The amplifier circuit 40 includes a first amplification path 41 coupled between an input node 42 and input-side node 12, and a second amplification path 43 also coupled between the input node 42 and the input-side node 12. In the illustrated embodiment, the input node 42 is configured to receive an input signal (for example, an RF signal). In some embodiments, for example, the input node 42 is coupled to a prior amplification stage (for instance, a variable gain amplifier (VGA)).

The input-side node 12 is coupled to circuit 10 for transforming the impedance of a load. In operation, a signal that is input at the input node 42 propagates through the amplifier circuit 40 to the output-side node 14.

The first amplification path 41 includes a first amplifier subsection 44 comprising one or more amplifiers. For example, the first amplifier subsection 44 can comprise multiple transistors coupled in parallel to one another, transistors coupled in series to one another, or a combination of both. The transistors in the first amplifier subsection 44 can be operated (individually or in combination with one another) as linear amplifiers (for example, as class AB or deep class AB amplifiers approaching class B amplifiers) or as saturated amplifiers (for example, as class D, E, or F amplifiers).

The second amplification path 43 includes a second amplifier subsection 45 also comprising one or more amplifiers as described above. For example, the second amplifier subsection 45 can comprise multiple transistors coupled in parallel to one another, transistors coupled in series to one another, or a combination of both. In some embodiments, the second amplifier subsection 45 comprises one HBT, whereas in other embodiments the second amplifier subsection 45 comprises two serially coupled HBTs or multiple parallel-connected HBTs.

In the illustrated embodiment, the second amplifier subsection 45 is configured to produce a smaller power gain than the first amplifier subsection 44. For example, the first amplifier subsection 44 may comprise M parallel-connected transistors, and the second amplifier subsection 45 may comprise N parallel-connected transistors, where M>N, so that the second amplifier subsection 45 consumes less power in operation than the first amplifier subsection 44. For this reason, the second amplifier subsection 45 is sometimes referred to herein as the "low-power amplifier subsection" and the amplification path 43 is sometimes referred to as the "low-power amplification path". Similarly, the first amplifier subsection 44 is sometimes referred to as the "high-power amplifier subsection," and the amplification path 41 is sometimes referred to as the "high-power amplification path."

In some embodiments, the high-power amplifier subsection 44 and the low-power amplifier subsection 45 are configured to operate in multiple power modes to provide different levels of power gain and power consumption. Furthermore, in some embodiments, more than 2 amplification paths are present.

The illustrated amplifier circuit 40 further includes a switching element 46, in order to controllably couple the output of the second amplifier subsection 45 to the input-side node 12. During low-power operation, the switching element 46 is closed, so that a signal amplified in the second amplifier subsection 45 can propagate to the load via the impedance transformation circuit 10.

The illustrated amplifier circuit 40 further includes a low-power impedance transformation network 48 coupled between the input-side node 12 and the output of the low-power amplifier subsection 45. In the illustrated embodiment, the low-power impedance transformation network 48 is configured to transform the impedance at its downstream end (at node 12) into a higher impedance during low-power operation. Additional transformation networks (not shown) can be provided upstream of the low-power amplifier subsection 45 or within the first amplification path 41.

By providing the low-power impedance transformation network 48, a plurality of real adjusted load impedance values as given by the transformation circuit 10 at the input-side node 12 can be further adjusted to real load impedance values present at the output side of the low-power amplifier subsection 45. Thus, by providing N different states of the transformation circuit 10, 2N different usable adjusted impedance values can be provided. N different usable adjusted impedance values are provided on the output side of the high-power amplifier section 44 and additional N different usable adjusted impedance values are provided on the output side of the low-power amplifier section 45.

The written description above uses specific embodiments to disclose the invention, including the best mode, and also to enable any person skilled in the art to make and use embodiments the invention. While the invention has been described in terms of various specific embodiments, those skilled in the art will recognize that embodiments of the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method comprising:
adapting an impedance of a load dependent on working conditions of an active device, using a controllable output-side adaptation network coupled between an output-side terminal of a transformer and an output-side node coupled with the load, to generated an adapted impedance; and
adjusting the adapted impedance within a predetermined frequency interval of a signal along a path between an input-side node coupled with the active device and the output-side node, independent of the working conditions of the active device, using the transformer, to generate an adjusted impedance, wherein the transformer comprises:
a first inductor having an input-side terminal, to receive the output of the active device via the input-side node; and
a second inductor having the output-side terminal, wherein the second inductor is magnetically coupled to the first inductor,
wherein the controllable output-side adaptation network includes a capacitive element arranged in series between the output-side terminal and the output-side node.

2. The method of claim 1, further comprising:
adapting the adjusted impedance using a controllable input-side adaptation network coupled between the input-side node and an input-side terminal.

3. The method of claim 2, wherein the controllable input-side adaptation network comprises at least a capacitive element arranged in series between the input-side node and the input-side terminal.

4. The method of claim 1, wherein adapting the impedance of the load comprises controlling the capacitance of the capacitive element.

5. The method of claim 4, wherein the controllable output-side adaptation network comprises at least a switching element responsive to a control signal, to control the capacitance.

6. The method of claim 1, wherein the capacitive element comprises a parallel circuit of at least two capacitors each connected in series with a switching element.

7. The method of claim 1, wherein the predetermined frequency interval of the signal ranges from −3% to +3% around a center frequency of the signal.

8. The method of claim 1, wherein the predetermined frequency interval of the signal ranges from −5% to +5% around a center frequency of the signal.

9. The method of claim 1, wherein real part of the adjusted impedance is adjusted such that the requested output power of the active device is close to the maximum possible output power related to the adjusted impedance.

10. The method of claim 1, wherein imaginary part of the adjusted impedance is smaller than 20% of the real part of the adjusted impedance of the load.

11. The method of claim 1, wherein the transformer has a fixed transformation ratio.

12. An amplification method, comprising:
selecting, in a first amplifier mode, a first amplification path coupled between a signal input node and an input-side node, the first amplification path comprising a high-power amplifier section, thereby providing a first gain to an RF signal;
selecting, in a second amplifier mode, a second amplification path coupled between the signal input node and the input-side node, the second amplification path comprising a low-power amplifier section, thereby providing a second gain to the RF signal; and
transforming an impedance of a load within a predetermined frequency interval of a signal along a path between an input-side node and an output-side node connected to the load, the method comprising:
adapting the impedance of the load dependent on working conditions of the high-power amplifier section and the low-power amplifier section, using a controllable output-side adaptation network coupled between an output-side terminal of a transformer and an output-side node coupled with the load, to generated an adapted impedance; and
adjusting the adapted impedance within the predetermined frequency interval, independent of the working conditions of the high-power amplifier section and the low-power amplifier section, using the transformer, to generate an adjusted impedance, wherein the transformer comprises:
a first inductor having an input-side terminal, to receive the output of the active device via the input-side node; and
a second inductor having the output-side terminal, wherein the second inductor is magnetically coupled to the first inductor.

13. The amplification method of claim 12, further comprising transforming, in the second amplifier mode, the impedance of the load using a low-power impedance transformation network coupled between the input-side node and the output of the low-power amplifier section.

14. A circuit comprising:
an input-side node connected to an active device;
an output-side node connected to a load;
a transformer, having a fixed transformation ratio, coupled between the input-side node and the output-side node, to adjust an adapted impedance of the load within a predetermined frequency interval of a signal output from the active device, along a path between the input-side node and the output-side node, independent of the working conditions of the active device, wherein the transformer comprises:
a first inductor having an input-side terminal to receive the signal output from the active device via the input-side node;
a second inductor having an output-side terminal, wherein the second inductor is magnetically coupled to the first inductor; and
a controllable output-side adaptation network coupled between the output-side terminal and the output-side node, to adapt the impedance of the load based on working conditions of the active device, to provide the adapted impedance.

15. The circuit of claim 14, further comprising a controllable input-side adaptation network coupled between the input-side node and the input-side terminal.

16. The circuit of claim 15, wherein the controllable input-side adaptation network comprises at least a capacitive element arranged in series between the input-side node and the input-side terminal.

17. The circuit of claim 14, wherein the controllable output-side adaptation network comprises at least a capacitive element arranged in series between the output-side terminal and the output-side node.

18. The circuit of claim 17, wherein the capacitance of the capacitive element is controllable.

19. The circuit of claim 17, wherein the capacitive element is selected from the group consisting of: capacitors, varactor diodes, parallel circuits of at least two capacitors, and microelectromechanical systems.

20. The circuit of claim 17, wherein the capacitive element comprises a parallel circuit of capacitors.

21. The circuit of claim 14, wherein the controllable output-side adaptation network comprises at least a switching element responsive to a control signal.

22. The circuit of claim 21, wherein the switching element is selected from the group consisting of: transistors and microelectromechanical systems.

23. The circuit of claim 17, wherein the capacitive element comprises a parallel circuit having at least two capacitors each connected in series with a switching element.

24. The circuit of claim 14, wherein the transformer is an integrated transformer.

25. The circuit of claim 14, wherein the coupling constant k of the transformer is larger than 0.8.

26. The circuit of claim 14, wherein the impedance of the first inductor lies in a range between the output impedance of the active device and 2 times the output impedance of the active device.

27. The circuit of claim 14, wherein the impedance of the second inductor lies in a range between the impedance of the load and 2 times the impedance of the load.

28. An amplifier circuit, comprising:
a first amplification path coupled between a signal input node and an input-side node, wherein the first amplification path includes a high-power amplifier section;
a second amplification path coupled between the signal input node and the input-side node, wherein the second amplification path includes a low-power amplifier section;
a circuit coupled between the input-side node and an output-side node connected to a load, to transform an impedance of the load within a predetermined frequency interval of a signal along a path between the input-side node and the output-side node, wherein the circuit comprises:
a transformer comprising:
a first inductor having an input-side terminal coupled with the input-side node, to receive the output of an active device via the input-side node, and
a second inductor having an output-side terminal, wherein the second inductor is magnetically coupled to the first inductor; and
a controllable output-side adaptation network coupled between the output-side terminal and the output-side node.

29. The amplifier circuit of claim 28, wherein the second amplification path comprises a low-power impedance transformation network coupled between the input-side node and the output of the low-power amplifier section.

30. The amplifier circuit of claim 28, wherein the second amplification path comprises a switching element coupled between the input-side node and the output of the low-power amplifier section.

31. The amplifier circuit of claim 28, wherein the controllable output-side adaptation network includes a capacitive element arranged in series between the output-side terminal and the output-side node.

* * * * *